United States Patent [19]
Kato et al.

[11] Patent Number: 5,573,886
[45] Date of Patent: *Nov. 12, 1996

[54] PHOTOSENSITIVE RESIN COMPOSITION COMPRISING A POLYIMIDE PRECURSOR AND METHOD FOR MAKING A POLYIMIDE FILM PATTERN FROM THE SAME

[75] Inventors: Hideto Kato, Takasaki; Satoshi Toyoda, Annaka, both of Japan

[73] Assignee: Shin-Etsu Chemical Co., Ltd., Tokyo, Japan

[ * ] Notice: The term of this patent shall not extend beyond the expiration date of Pat. No. 5,441,845.

[21] Appl. No.: 375,837

[22] Filed: Jan. 20, 1995

[30] Foreign Application Priority Data

Jan. 21, 1994 [JP] Japan .................. 6-021951

[51] Int. Cl.$^6$ .................. G03F 7/023; G03F 7/40
[52] U.S. Cl. .................. 430/192; 430/165; 430/193; 430/320; 430/326
[58] Field of Search .................. 430/165, 192, 430/193, 326, 320

[56] References Cited

U.S. PATENT DOCUMENTS

| | | | |
|---|---|---|---|
| 5,104,768 | 4/1992 | Sassmannshausen et al. | 430/193 |
| 5,114,826 | 5/1992 | Kwong et al. | 430/192 |
| 5,348,835 | 9/1994 | Oba et al. | 430/192 |
| 5,441,845 | 8/1995 | Okinoshima et al. | 430/192 |

FOREIGN PATENT DOCUMENTS

| | | |
|---|---|---|
| 43-18790 | 8/1968 | Japan . |
| 49-115541 | 11/1974 | Japan . |
| 54-145794 | 11/1979 | Japan . |
| 55-45746 | 3/1980 | Japan . |

OTHER PUBLICATIONS

"Preparation of Positive Photoreactive Polyimides and their Characterization" Journal of Applied Polymer Science, vol. 33, 1763–1775 (1987).

Primary Examiner—John S. Y. Chu
Attorney, Agent, or Firm—Lowe, Price, LeBlanc & Becker

[57] ABSTRACT

A photosensitive resin composition which comprises (A) a polyimide resin precursor of recurring units of a specific type, (B) at least one member selected from the group consisting of photosensitive diazoquinone compounds of the following formulas

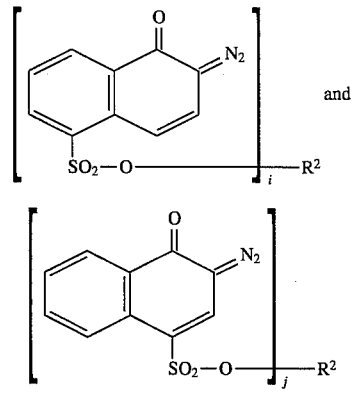

wherein $R^2$ represents an organic group having from 1 to 50 carbon atoms, i is an integer of from 1 to 7, and i is an integer of from 1 to 7, and (C) a phenolic novolac resin. A method for forming a polyimide film pattern on various types of substrates is also described wherein a composition film is alkali-developed after imagewise exposure and cured to provide a heat-resistant polyimide film pattern suitable for protecting the substrate.

17 Claims, No Drawings

PHOTOSENSITIVE RESIN COMPOSITION COMPRISING A POLYIMIDE PRECURSOR AND METHOD FOR MAKING A POLYIMIDE FILM PATTERN FROM THE SAME

BACKGROUND OF THE INVENTION

1. Field of the Invention

This invention relates to a photosensitive resin composition which is useful as a protective insulating film for semiconductor devices, an alignment film for liquid crystal devices and an insulating film for multi-layered printed circuit boards. The invention also relates to a method for making a polyimide film patterned in a desired form on various types of substrates.

2. Description of the Prior Art

Polyimides or polyimide compositions are known as a heat-resistant photosensitive material. For instance, a negative photosensitive material is well known in the art wherein polyamic acid precursors are introduced at the carboxyl groups thereof with photo-crosslinking groups through ester bonds (Japanese Laid-open Patent Application Nos. 49-115541 and 55-45746) or with ionic bonds (Japanese Laid-open Patent Application No. 54-145794). On the other hand, positive photosensitive polyimide materials have also been reported including a material wherein o-nitrobenzyl esters are introduced at the side chains of polyimides (J. Appl. Polym. Sci., 33, 1763 (1987)), or polyamic acid silyl esters to which an onium salt is added as a photosensitive material.

Positive photosensitive polyimides which can be developed with an alkaline aqueous solution may be utilized in existing photoresist developing devices and the film of the polyimide is substantially free of swelling at the time of the development.

The positive working mechanism of the photosensitive polyimides is as follows: when the polyimide is exposed to light, the portions where exposed become more soluble in an alkaline aqueous solution; and when the exposed polyimide film is developed with an alkaline aqueous solution, the exposed portions are dissolved out thereby forming a pattern. With known positive photosensitive polyimides, however, non-exposed portions of the resin are dissolved in the alkaline aqueous solution to some extent. This eventually leads to a reduction in film thickness at the non-exposed portions. Thus, the film thickness varies after the development, presenting the problem that the dimensional accuracy is not good. Moreover, the solubility of the exposed portions appreciably differs depending on the type of polyimide used as a starting material. Some types of materials may be low in sensitivity with a lowering of resolution.

SUMMARY OF THE INVENTION

It is an object of the invention to provide a positive photosensitive resin composition which is highly sensitive to light, can be developed with an alkaline aqueous solution and is capable of yielding a heat-resistant polyimide film without an appreciable degree of film loss at the time of development It is another object of the invention to provide a method for forming a polyimide film pattern on any desired substrate by use of the composition of the above-mentioned type.

We made intensive studies in order to solve the problems of the prior art. As a result, it was found that when polyamic acid silyl esters are formulated with diazonaphthoquinone-sulfonic esters and a phenolic novolac resin, the solubility in an alkaline aqueous solution after exposure of the mixture to light increases, with the difference between the solubilities prior to and after the exposure being great. In addition, the composition has good photosensitivity and is small in film loss on development after the exposure to light.

The above objects can be achieved, according to one embodiment of the invention, by a photosensitive resin composition which comprises:

(A) a polyimide resin precursor of recurring units of the following general formula (1)

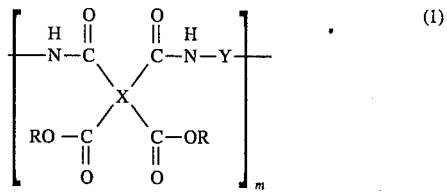

wherein R's may be the same or different and independently represent a silyl group of the following general formula (2)

wherein $R^1$'s may be the same or different and independently represent a hydrogen atom or a monovalent organic group having from 1 to 8 carbon atoms, X represents a tetravalent organic group, Y represents a divalent organic group, and m is an integer of from 5 to 80;

(B) at least one member selected from the group consisting of photosensitive diazoquinone compounds of the following formulas (3) and (4)

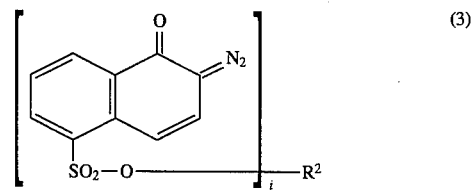

wherein $R^2$ represents an organic group having from 1 to 50 carbon atoms and i is an integer of from 1 to 7

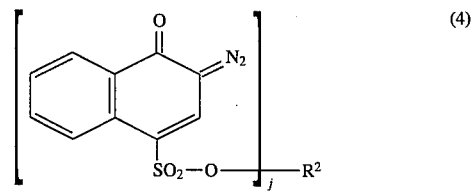

wherein $R^2$ has the same meaning as defined above and i is an integer of from 1 to 7; and (C) a phenolic novolac resin of the following general formula (5)

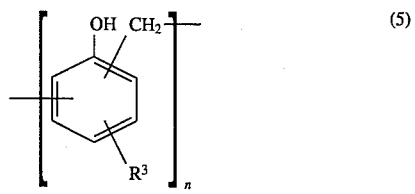

wherein $R^3$'s may be the same or different and represent a hydrogen atom or an organic group having from 1 to 6 carbon atoms, and n is an integer of from 2 to 100.

According to another embodiment of the invention, there is also provided a method for forming a polyimide film pattern which comprises applying a photosensitive composition of the type defined above onto a substrate, drying the applied composition, exposing the resultant film to light in an imagewise pattern, and subjecting the exposed film to alkali development, and curing the resultant polyimide film pattern on the substrate.

DETAILED DESCRIPTION AND EMBODIMENTS OF THE INVENTION

The photosensitive composition of the invention comprises three essential ingredients, which are described in detail.

(A) Polyimide resin precursor

The polyimide resin precursor (A) used in the composition of the invention is represented by the general formula (1) defined hereinabove. In the formula (1), if the precursor contains a plurality of X's in one molecule, X's may be the same or different. Likewise, if a plurality of Y's are present in the molecule, Y's may be the same or different, m is an integer of from 5 to 80, preferably from 25 to 60.

In the formula, X is a tetravalent organic group. Typical and preferred examples include those indicated below but not limited thereto

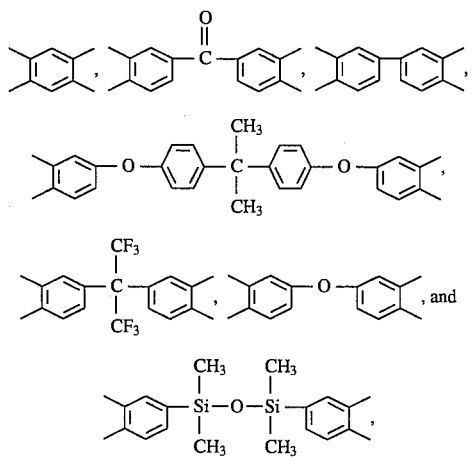

Of these, the groups of the following formulas are preferred

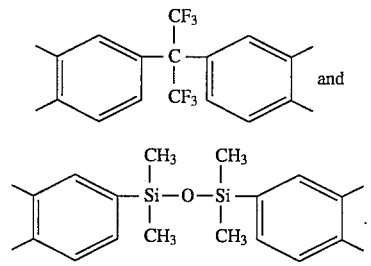

Y in the general formula (1) is a divalent organic group represented by the general formula (6), (7), (8), (9), (10) or (11). The organic group of the general formula (6) is shown below

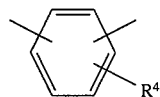

wherein $R^4$ represents a hydrogen atom, a chlorine atom, a —$CONH_2$ group or an alkyl group having from 1 to 3 carbon atoms such as methyl, ethyl or propyl group.

The general formula (7) is shown below

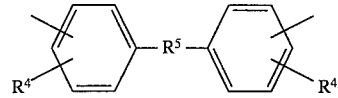

wherein $R^4$'s may be the same or different and have, respectively, the same meaning as defined above, and $R^5$ represents a single bond, —O—, —$SO_2$—, —S—, or a substituted or unsubstituted alkylene group having from 1 to 3 carbon atoms such as —$CH_2$—, —$C(CH_3)_2$— or —$C(CF_3)_2$—.

The general formula (8) is shown below

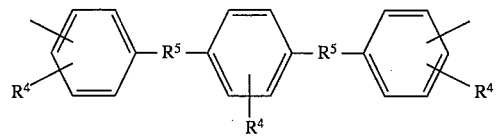

wherein $R^4$'s and $R^5$'s have, respectively, the same meanings as defined in the foregoing formulas.

The general formula (9) is shown below

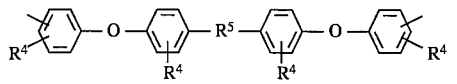

wherein $R^4$'s and $R^5$'s have, respectively, the same meanings as defined in the foregoing formulas.

The general formula (10) is shown below as having a siloxane bond or bonds therein

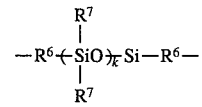

wherein $R^6$'s may be the same or different and independently represent an alkylene group having 3 or 4 carbon atoms such as —$C_3H_6$—, —$C_4H_8$— or the like, a phenylene group, or a group of the following formula

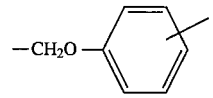

and $R^7$'s may be the same or different and independently represent an alkyl group having from 1 to 3 carbon atoms such as —$CH_3$, —$C_2H_5$, —$C_3H_7$ or the like or a phenyl group, and k is an integer of from 1 to 40.

The general formula (11) is shown below as having a silethylene or silphenylene bond

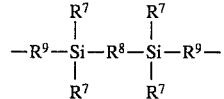

wherein $R^7$'s may be the same or different and have the same meaning as defined in the foregoing formula, $R^8$ represents an ethylene group or a phenylene group, and $R^9$'s may be the same or different and independently represent an alkylene group having 3 to 4 carbon atoms such as —$C_3H_6$— or —$C_4H_8$—.

Specific and preferred examples of the group represented by Y include those of the following formulas

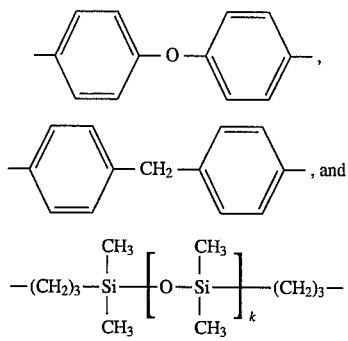

wherein k is an integer of from 1 to 40.

R's in the general formula (1) may be the same or different and independently represent a silyl group of the general formula (2). In the formula (2), $R^1$'s may be the same or different and independently represent a hydrogen atom or a monovalent organic group having from 1 to 8 carbon atoms. Specific examples of the monovalent organic group include alkyl groups such as a methyl group, an ethyl group, a propyl group, a butyl group and the like, alkenyl groups such as a vinyl group, an allyl group, a butenyl group and the like, and aryl groups such as a phenyl group, a tolyl group and the like. Moreover, those groups mentioned above but substituted at part or all of the hydrogen atoms bonded to the carbon atoms thereof with a halogen atom, a cyano group, an alkoxy group or the like, e.g. a chloromethyl group, a chloropropyl group, a 3,3,3-trifluoropropyl group, a 2-cyanoethyl group, a methoxy group, an ethoxyethyl group and the like. It will be noted that the monovalent groups are not limited to those indicated above and may include other groups provided than they have from 1 to 8 carbon atoms.

The polyimide resin precursor of the general formula (1) can be prepared according to known procedures, for example, as taught in Japanese Patent Publication No. 43-18790. For instance, tetracarboxylic dianhydrides of the following general formula (12)

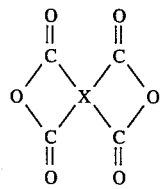

(12)

wherein X has the same meaning as defined with respect to the general formula (1) and silyldiamine compounds of the following general formula (13)

$$RN-Y-NR \atop H \quad\quad H \qquad (13)$$

wherein R's and Y have, respectively, the same meanings as defined hereinbefore are reacted substantially at equimolar amounts in an appropriate inert solvent at a temperature of from 0° to 40° C. Usually, the reaction time ranges from 1 to 24 hours. Other procedures may be used provided that the polyimide resin precursors as defined hereinbefore can be obtained.

The inert solvents used in the above procedure should preferably be capable of dissolving the resultant polyimide resin precursor. Specific examples include N-methyl-2-pyrrolidone, N,N-dimethylacetamide, dimethylformamide, hexamethylphosphoramide, tetrahydrofuran, 1,4-dioxane, methyl cellosolve (ethylene glycol monomethyl ether), butyl cellosolve (ethylene glycol monobutyl ether), diethylene glycol dimethyl ether, diethylene glycol diethyl ether, triethylene glycol dimethyl ether, acetone, methyl isobutyl ketone, cyclopentanone, cyclohexanone, γ-butyrolactone, butyl cellosolve acetate (ethylene glycol monobutyl ether acetate), toluene, xylene, anisole, methylanisole, ethyl phenyl ether and the like. These may be used singly or in combination.

The tetracarboxylic dianhydrides of the general formula (12) include, for example, pyromellitic dianhydride, benzophenonetetracarboxylic dianhydride, 3,3',4,4'-biphenyltetracarboxylic dianhydride, 2,2-bis[4-(3,4dicarboxyphenoxy)phenyl]propanoic dianhydride, 2,2-bis(3,4-dicarboxyphenyl]perfluoropropanoic dianhydride, bis(3, 4dicarboxyphenyl)dimethylsilanoic dianhydride, 1,3-bis(3, 4-dicarboxyphenyl)-1,1,3,3-tetramethyldisiloxanoic dianhydride and the like. These may be used on their own or in combination.

The silyldiamine compounds of the general formula (13) can be prepared by subjecting diamine compounds of the following general formula (14)

$$H_2N-Y-NH_2 \qquad (14)$$

wherein Y has the same meaning as defined before, and chlorosilane compounds of the following general formula (15)

(15)

wherein $R^1$'s may be the same or different and have, respectively, the same meaning as defined before, to condensation by use of bases.

The diamine compounds of the general formula (14) include, for example, aromatic diamines such as p-phenylenediamine, m-phenylenediamine, 4,4'diaminophenylmethane, 4,4'-diaminodiphenyl ether, 2,2'-bis(4-aminophenyl)propane, 4,4'-diaminodiphenylsulfone, 4,4'diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-(p-aminophenylthio ether)benzene, 1,4-bis(m-aminophenylthio ether)benzene, 2,2-bis[4-(4aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1bis[3-methyl-4-(4-aminophenoxy)phenyl]ethane, 1,1-bis[3-chloro-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl- 4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, 2,2bis[4-(4-aminophenoxy)phenyl]perfluoropropane and the like. Alternatively, there may be used diamine compounds having siloxane bond or bonds therein, examples of which include the compounds of the following formulas

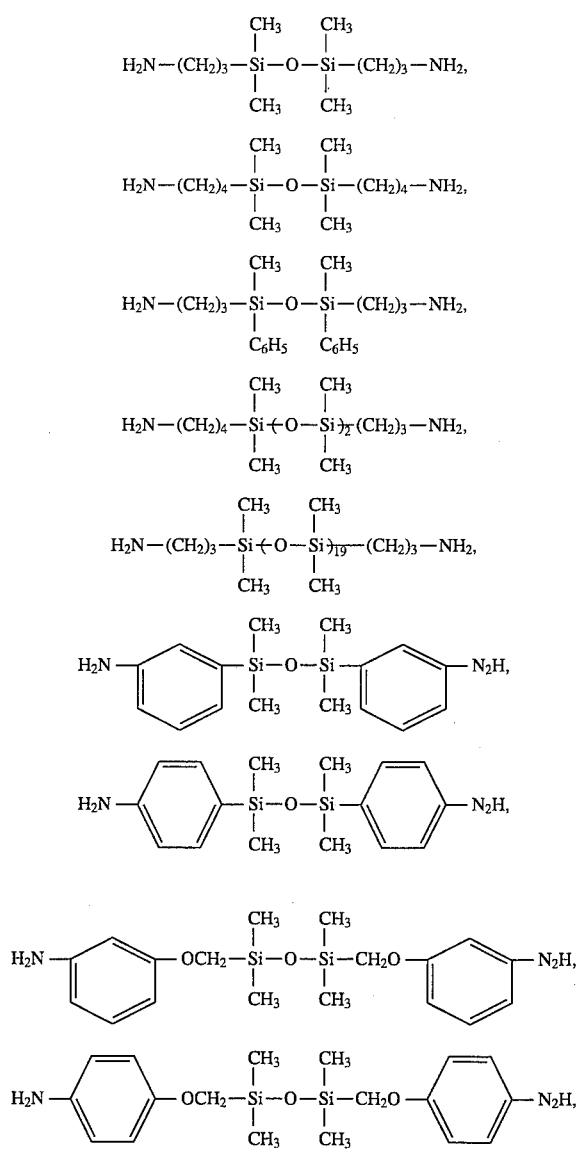

Still alternatively, diamine compounds of the following formulas having silethylene or silphenylene bonds may also be used

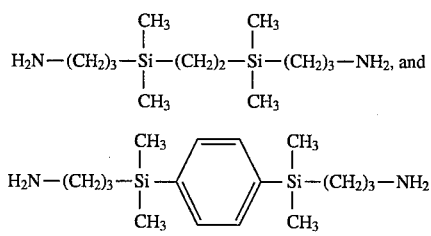

These diamine compounds may be used singly or in combination.

In the composition of the invention, the polyimide resin precursors (A) may be used on their own or in combination.

(B) Photosensitive diazoquinones

The photosensitive diazoquinone compounds are of the afore-indicated general formula (3) or (4).

In the formula (3) or (4), $R^2$ represents a mono to heptavalent organic group having from 1 to 50 carbon atoms. Preferably, $R^2$ represents a group having a benzene ring therein. Specific examples of the diazoquinone compound include

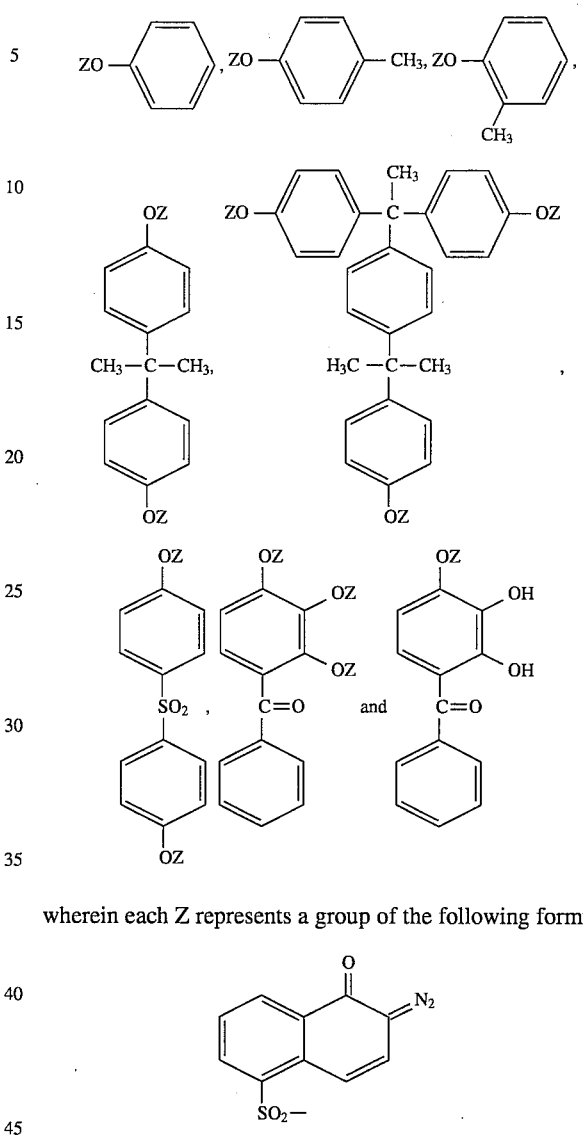

wherein each Z represents a group of the following formula

The amount of the diazoquinone compound (B) is preferably in the range of from 2 to 100 parts by weight, more preferably from 4 to 60 parts by weight, per 100 parts by weight of the ingredient (A).

The photosensitive diazoquinone compounds (B) may be used singly or in combination.

(C) Cresol-novolac resins

The cresol novolac resins used in the present invention are represented by the foregoing general formula (5), in which $R^3$'s may be the same or different and independently represent a hydrogen atom or a monovalent organic group having from 1 to 6 carbon atoms and n is an integer of from 2 to 100. Examples of the monovalent organic groups include substituted or unsubstituted alkyl group such as —$CH_3$, —$CF_3$, —$C_2H_5$, —$C_3H_7$ and the like although not limited to these groups.

The cresol novolac resins of the formula (5) can be prepared, for example, by subjecting phenol derivatives of the following general formula (16)

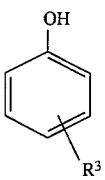

(16)

wherein R³ has the same meaning as defined above, to hydroformylation reaction with a formaldehyde aqueous solution or anhydrous formaldehyde. The preparation is not limited to the above process and other procedures may be used so far as the cresol novolac resins of the formula (5) are obtained.

The catalysts used in the above process may be organic acids such as oxalic acid, p-toluenesulfonic acid and the like and inorganic acids such as hydrochloric acid, sulfuric acid and the like. These acids may be used singly or in combination.

The cresol novolac resin (C) should preferably be present in an amount of from 1 to 100 parts by weight, more preferably from 3 to 50 parts by weight, per 100 parts by weight of the ingredient (A).

Of course, the cresol novolac resins (C) may be used singly or in combination.

Photosensitive resin composition

The photosensitive resin composition of the invention is stored and used as comprising the polyimide resin precursor (A), photosensitive diazoquinone compound (B) and phenolic novolac resin (C) usually in the form of a solution in an appropriate organic solvent.

The organic solvents are favorably those solvents which are used for the preparation of the polyimide resin precursor (A). These solvents are usually employed on their own or in combination. When used, the amount of the solvent is usually in the range of from 100 to 2000 parts by weight per 100 parts by weight of the precursor (A).

The solution dissolving the photosensitive resin composition of the invention in an organic solvent may be applied onto various types of substrates, such as silicon wafers, metallic sheets, glass sheets, ceramic substrates and the like, by any known procedures such as spin coating, immersion, printing and the like. After drying, the resultant film is exposed to light in an imagewise pattern and then subjected to alkali development and curing to obtain a heat-resistant polyimide protective film on the substrate.

The film formation through drying may be effected by pre-baking at a temperature of from 30° to 180° C. for several minutes to several hours by means of a drying oven, a hot plate or the like thereby removing a substantial amount of the organic solvent from the applied composition.

The light exposure is performed by placing a mask of a desired form on the film and subjecting to light such as visible light, UV light or the like for several seconds to several minutes.

After the exposure to light, the exposed portions are dissolved out by means of a liquid developer to obtain a relief pattern. Such liquid developers are preferably alkaline aqueous solutions 1 including, for example, an aqueous solution of tetramethylammonium hydroxide.

The thus developed relief pattern resin is then heated in a drying oven, electric furnace or the like at a temperature of from 200° to 500° C., preferably from 300° to 400° C. for several tens minutes to several hours, thereby forming a polyimide film pattern.

How a polyimide resin precursor becomes soluble in an alkaline aqueous solution is briefly described.

First, when a photosensitive diazoquinone is irradiated with UV light or visible light, it is converted to a carboxylic acid as follows

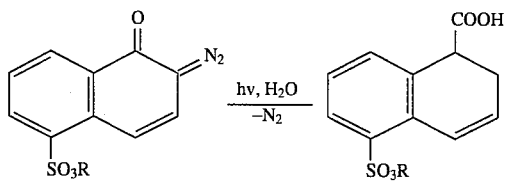

Thus, the resultant acid becomes hydrophilic and soluble in an alkaline aqueous solution.

The polyimide resin precursor is hydrolyzed at the silyl groups by means of the thus formed acid, thereby forming carboxyl groups and rendering the precursor soluble in water.

The invention is more particularly described by way of example, which should not be construed as limiting the invention thereto. Comparative example is also shown.

Preparation of a solution of polyimide resin precursor 39.5 g of diethylene glycol dimethyl ether and 39.5 g of N,N-dimethylacetamide were added to 22.2 g (0.050 moles) of 2,2-bis(3,4-dicarboxyphenyl)perfluoropropanoic anhydride in an atmosphere of nitrogen. A solution of 15.51 g (0.045 moles) of N,N-bis(trimethylsilyl)-4,4'-diaminodiphenyl ether and 1.98 g (0.005 moles) of 1,3-bis[3-(N-trimethylsilyl)aminopropyl]-1,1,3,3-tetramethyldisiloxane dissolved in a mixture of 20 g of diethylene glycol dimethyl ether and 20 g of N,N-dimethylacetamide were dropped in the resultant mixture while cooling so that the reaction temperature did not exceed 40° C. After completion of the dropping, the mixture was continued to agitate for further 12 hours. As a result, a solution of a polyimide precursor (number average molecular weight: $1.21 \times 10^4$, weight average molecular weight: $2.68 \times 10^4$) having recurring units of the following formula was obtained as having a viscosity of 4600 centipoises at 25° C. and a nonvolatile matter content of 25%

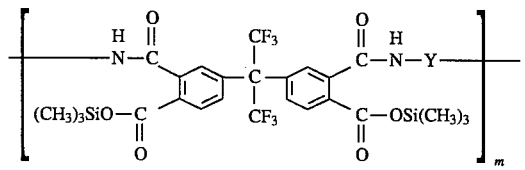

wherein Y represents a group of the following formula (17)

(17)

and a group of the following formula (18)

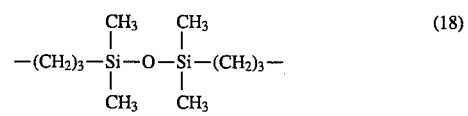

(18)

provided that the ratio by mole between the groups of the formulas (17) and (18) was 9:1, and m is a value of 34 on average.

Preparation of photosensitive diazoquinone compound 0.5 moles of o-cresol and 0.51 moles of 1,2-naphthoquinone-2-diazido-5-sulfonyl chloride were reacted in 1,2-dioxane in the presence of triethylamine, followed by washing with water and drying to obtain a photosensitive diazoquinone compound of the following formula

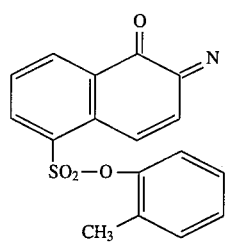

Preparation of cresol novolac resin m-Cresol, p-cresol and formalin were reacted at a molar ratio of m-cresol and p-cresol of 45:55 and at a molar ratio between the total of the cresols and formalin of 1:0.75 in the presence of oxalic acid under reflux. After completion of the reaction, the resultant reaction mixture was neutralized, followed by washing with water and dehydration to obtain a cresol novolac resin (number average molecular weight= $1.02 \times 10^3$, weight average molecular weight=$2.91 \times 10^3$) of the following reaction formula

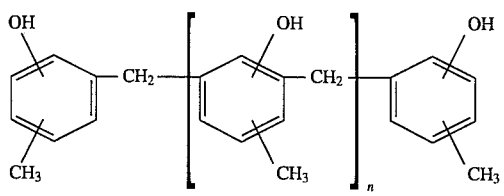

wherein n is a value of 24 on average.

EXAMPLE 1

48.0 g of the polyimide resin precursor solution, 3.0 g of the photosensitive diazoquinone compound and 3.0 g of the cresol novolac resin, all obtained above, were mixed to obtain a photosensitive composition. This composition was applied onto a silicon wafer by means of a spin coater, followed by soft baking on a hot plate to form a photosensitive resin film. This film was exposed to light from a high pressure mercury lamp (exposure: 600 mJ/cm$^2$), followed by development with a 2.3% tetramethylammonium hydroxide aqueous solution and rinsing with pure water. Thereafter, the film thicknesses and dissolution speeds of the exposed and non-exposed portions were, respectively, determined. The results are shown in Table 1.

Comparative Example 1

48.0 g of the polyimide resin precursor solution and 3.0 g of the photosensitive diazoquinone compound, both obtained hereinabove, were mixed to obtain a photosensitive resin composition. The composition was applied onto a silicon wafer by means of a spin coater, followed by soft baking on a hot plate to form a photosensitive resin film. This film was exposed to light from a high pressure mercury lamp (exposure: 600 mJ/cm$^2$), followed by development with a 2.3% tetramethylammonium aqueous solution and rinsing with pure water. Thereafter, the film thicknesses and dissolution speeds of the exposed and non-exposed portions were, respectively, determined. The results are shown in Table 1.

TABLE 1

| Sample | Film Thickness Before Development (μm) | Film Thickness After Development (μm) | | Dissolution Speed (μm/minute) | |
|---|---|---|---|---|---|
| | | Non-exposed Portion | Exposed Portion | Exposed Portion | Non-exposed Portion |
| Example 1 | 3.04 | 2.71 | 0.0 | 6.0 or over | 0.66 |
| Comparative Example 1 | 2.97 | 2.26 | 0.0 | 8.1 or over | 1.93 |

The dissolution speed at the non-exposed portion in the comparative example is significantly larger than that in the example. The reduction in the film thickness in Example 1 is smaller and thus, the composition of the invention is better. As will be apparent from the foregoing, the photosensitive composition of the invention is developable with an alkaline aqueous solution without an appreciable degree of reduction in film thickness, thereby providing a heat-resistant film. The composition of the invention is useful in forming protective films for electronic parts.

What is claimed is:

1. A photosensitive resin composition which comprises:

(A) a polyimide resin precursor of recurring units of the following general formula (1)

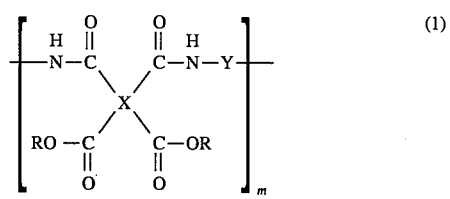

wherein R's may be the same or different and independently represent a silyl group of the following general formula (2)

wherein $R^1$'s may be the same or different and independently represent a hydrogen atom or a monovalent organic group having from 1 to 8 carbon atoms, X represents a tetravalent organic group, Y represents a divalent organic group, and m is an integer of from 5 to 80;

(B) at least one member selected from the group consisting of photosensitive diazoquinone compounds of the following formulas (3) and (4)

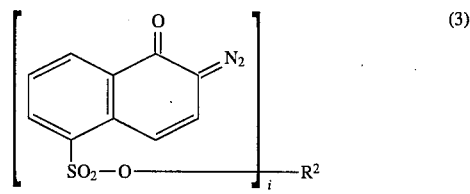

wherein $R^2$ represents an organic group having from 1 to 50 carbon atoms and i is an integer of from 1 to 7

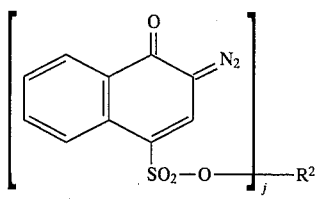

wherein $R^2$ has the same meaning as defined above and i is an integer of from 1 to 7; and (C) a phenolic novolac resin of the following general formula (5)

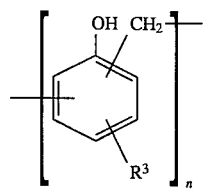

wherein $R^3$'s may be the same or different and independently represent a hydrogen atom or an organic group having from 1 to 6 carbon atoms, and n is an integer of from 2 to 100.

2. A photosensitive resin composition according to claim 1, wherein X in the formula (1) is at least one member selected from the group consisting of

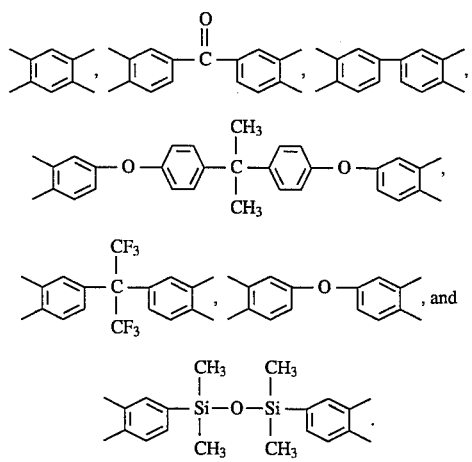

3. A photosensitive resin composition according to claim 2, wherein X is

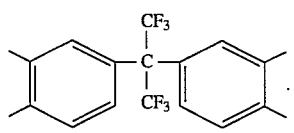

4. A photosensitive resin composition according to claim 2, wherein X is

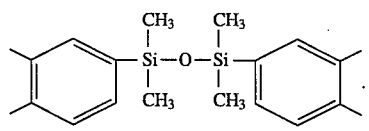

5. A photosensitive resin composition according to claim 1, wherein Y in the formula (1) represents at least one member selected from the group consisting of the groups of the formulas (6) to (11)

wherein $R^4$ represents a hydrogen atom, a chlorine atom, a —$CONH_2$ group or an alkyl group,

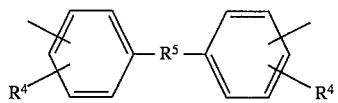

wherein $R^4$'s may be the same or different and have the same meaning as defined above, and $R^5$ represents a single bond, —O—, —$SO_2$—, —S—, or a substituted or unsubstituted alkylene group having from 1 to 3 carbon atoms,

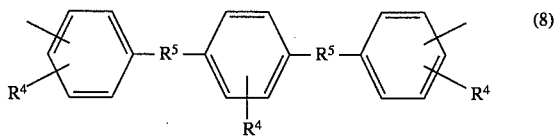

wherein $R^4$'s and $R^5$'s have, respectively, the same meanings as defined above,

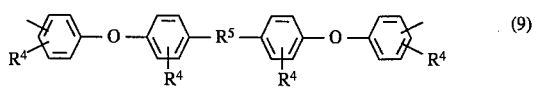

wherein $R^4$'s and $R^5$'s have, respectively, the same meanings as defined above

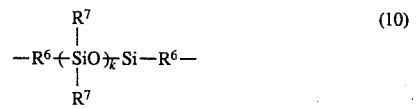

wherein $R^6$'s may be the same or different and independently represent an alkylene group having 3 or 4 carbon atoms, a phenylene group, or a group of the following formula

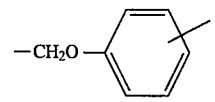

and $R^7$'s may be the same or different and independently represent an alkyl group having from 1 to 3 carbon atoms and k is an integer of from 1 to 40, and

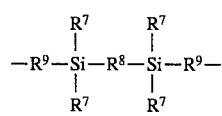

wherein $R^7$'s may be the same or different and have the same meaning as defined in the foregoing formula, $R^8$ represents an ethylene group or a phenylene group, and $R^9$'s may be the same or different and independently represent an alkylene group having 3 to 4 carbon atoms.

6. A photosensitive resin composition according to claim 5, wherein Y is

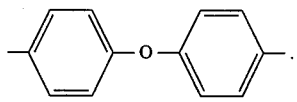

7. A photosensitive resin composition according to claim 5, wherein Y is

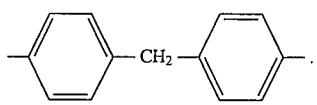

8. A photosensitive resin composition according to claim 5, wherein Y is

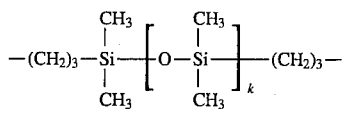

wherein k is an integer of from 1 to 40.

9. A photosensitive resin composition according to claim 1, wherein $R^2$ is an organic group having a benzene ring.

10. A photosensitive resin composition according to claim 9, wherein $R^2$ is at least one member selected from the group consisting of

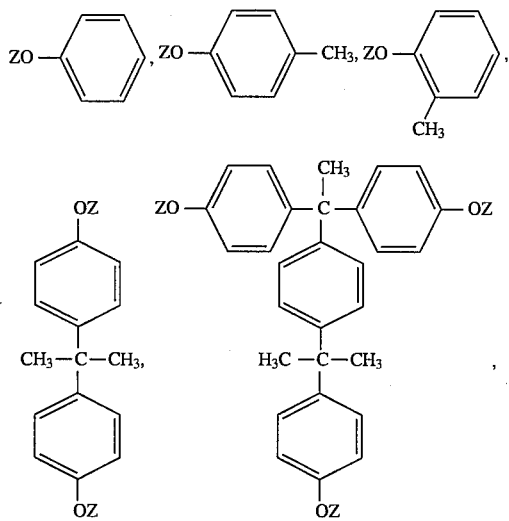

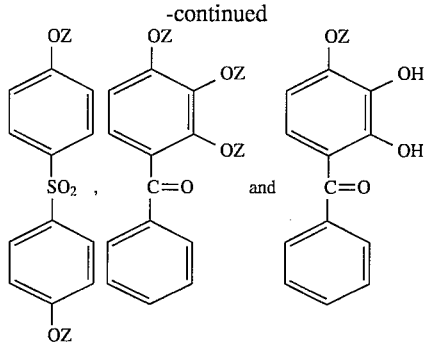

wherein each Z represents a group of the following formula

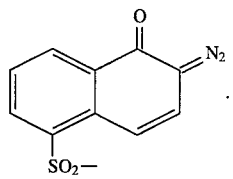

11. A photosensitive resin composition according to claim 1, wherein said photosensitive diazoquinone compound is present in an amount of from 2 to 100 parts by weigh per 100 parts by weight of said polyimide resin precursor.

12. A photosensitive resin composition according to claim 1, wherein said phenolic novolac resin is present in an amount of from 1 to 100 parts by weight per 100 parts by weight of said polyimide resin precursor.

13. A photosensitive resin composition according to claim 1, wherein said composition is in the form of a solution in an organic solvent for the ingredients (A), (B) and (C) and said solvent is present in an amount of from 100 to 2000 parts by weight per 100 parts by weight of said polyimide resin precursor.

14. A cured product of said photosensitive resin composition defined in claim 1.

15. A method for forming a polyimide film pattern which comprises applying a photosensitive composition defined in claim 1 onto a substrate, drying the applied composition, exposing the resultant film to light in an imagewise pattern, and subjecting the exposed film to alkali development to form a relief pattern, and curing the resultant film pattern on the substrate thereby forming a polyimide film.

16. A method according to claim 15, wherein said light is visible light or UV light.

17. A method according to claim 15, wherein said film pattern is cured at a temperature of from 200° to 500° C.

* * * * *